US012704558B2

(12) United States Patent
Bonaccorso et al.

(10) Patent No.: US 12,704,558 B2
(45) Date of Patent: Aug. 11, 2026

(54) ELECTROCHEMICAL IMPEDANCE SPECTROSCOPY EXCITATION THROUGH BATTERY PASSIVE BALANCING CIRCUIT

(71) Applicant: STMICROELECTRONICS INTERNATIONAL N.V., Geneva (CH)

(72) Inventors: Filippo Bonaccorso, Catania (IT); Marco Maria Branciforte, Catania (IT); Fabrizio La Rosa, San Pietro Clarenza (IT); Alessandro Carmelo Faulisi, Mascalucia (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 165 days.

(21) Appl. No.: 18/668,481

(22) Filed: May 20, 2024

(65) Prior Publication Data

US 2025/0355051 A1 Nov. 20, 2025

(51) Int. Cl.

| | |
|---|---|
| ***G01R 31/389*** | (2019.01) |
| ***G01R 31/00*** | (2006.01) |
| ***G01R 31/3842*** | (2019.01) |
| ***G01R 31/392*** | (2019.01) |
| ***G01R 31/396*** | (2019.01) |
| ***H01M 10/42*** | (2006.01) |
| ***H01M 50/204*** | (2021.01) |

(52) U.S. Cl.

CPC ....... *G01R 31/389* (2019.01); *G01R 31/3842* (2019.01); *G01R 31/392* (2019.01); *G01R 31/396* (2019.01); *H01M 10/425* (2013.01); *H01M 50/204* (2021.01); *H01M 2010/4271* (2013.01); *H01M 2010/4278* (2013.01)

(58) Field of Classification Search

CPC ...... G01R 31/00; G01R 31/38; G01R 31/389; G01R 31/39; G01R 31/392; G01R 31/396; G01R 31/3842; H01M 50/204; H01M 10/425; H01M 10/44; H01M 10/48

See application file for complete search history.

(56) References Cited

U.S. PATENT DOCUMENTS

| | | | | |
|---|---|---|---|---|
| 11,644,513 | B1 | 5/2023 | Ding et al. | |
| 12,025,675 | B2 * | 7/2024 | Ogirko ................. | G01R 31/389 |
| 12,429,527 | B2 * | 9/2025 | Santhamma ......... | G01R 31/389 |
| 2021/0356525 | A1 | 11/2021 | Van Vroonhoven | |
| 2023/0035509 | A1 | 2/2023 | Pourfath et al. | |
| 2023/0064240 | A1 | 3/2023 | Zhou et al. | |
| 2023/0105040 | A1 | 4/2023 | Wienhausen et al. | |

* cited by examiner

*Primary Examiner* — Neel D Shah

(74) *Attorney, Agent, or Firm* — Alston & Bird LLP

(57) ABSTRACT

Systems, apparatuses, and methods for electrochemical impedance spectroscopy (EIS) for use with batteries are provided, including for a battery passive balancing circuit that may be used to generate a stimulus signal for EIS analysis of one or more batteries. An exemplary system may comprise a first battery cell with a first charge and a second battery cell with a second charge. Battery balancing circuitry generates a balancing signal to balance the charges. The battery balancing circuitry transmits the balancing signal to an EIS circuitry. The EIS circuitry provides a stimulus signal to one of the battery cells based on the first balancing signal, receives a response signal based on the stimulus signal, and generates at least one output signal based on the response signal. A battery management system receives the at least one output signal and generates an impedance.

20 Claims, 7 Drawing Sheets

ELECTROCHEMICAL IMPEDANCE SPECTROSCOPY EXCITATION THROUGH BATTERY PASSIVE BALANCING CIRCUIT

TECHNOLOGICAL FIELD

Example embodiments of the present disclosure relate generally to systems, apparatuses, and methods for electrochemical impedance spectroscopy (EIS) for use with batteries, and particularly for a battery balancing circuit that may be used to generate a stimulus signal for EIS analysis of one or more batteries.

BACKGROUND

Batteries are increasingly being used in a myriad of applications, including electric vehicles, power tools, consumer electronics, and the like. These application may include many systems, such batteries with battery balancing. Many of these applications also integrate Battery Management System (BMS) integrated circuits (ICs) that monitor battery conditions and attempt to maximize the battery capacity and the lifetime, including through battery cell balancing.

Electrochemical impedance spectroscopy (EIS) may be used to generate information for determining a state of health of batteries. The state of health of a battery may indicate if a battery is healthy or aged, which may be used to prevent battery damage or determine when a battery should no longer be used. EIS may also be used to identify damage in the structure of a battery. EIS may additional be used to identify thermal drift and, consequently, potential battery explosion.

The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to electrochemical impedance spectroscopy (EIS) for use with batteries, and particularly for a battery balancing circuit that may be used to generate a stimulus signal for EIS analysis of one or more batteries.

In accordance with some embodiments of the present disclosure, an example system is provided. The system may comprise: a plurality of battery cells, including at least a first battery cell and a second battery cell, wherein the first battery cell has a first charge and the second battery cell has a second charge; passive battery balancing circuitry configured to generate at least a first passive balancing signal to balance the first charge of the first battery cell and the second charge of the second battery cell when the first charge and the second charge are different; wherein the passive battery balancing circuitry is further configured to provide the first passive balancing signal to an EIS circuitry; wherein the EIS circuitry is configured to receive the first passive balancing signal and to provide a stimulus signal based on the first passive balancing signal to at least one of the plurality of battery cells, receive a response signal from the at least one of the plurality of battery cells based on the stimulus signal, and to generate at least one output signal based on the response signal; and a battery management system configured to receive the at least one output signal and determine at least one impedance.

In some embodiments, the passive battery balancing circuitry is further configured to passively balance each charge of each battery cell of the plurality of battery cells.

In some embodiments, the battery management system is further configured to determine a state of health of at least one of the plurality of battery cells based on the at least one impedance.

In some embodiments, to generate the at least one output signal based on the at least one response signal the EIS circuitry is further configured to synchronously acquire at least one voltage signal based on the response signal and at least one current signal based on the response signal.

In some embodiments, the at least one impedance includes at least one impedance for each of the plurality of battery cells.

In some embodiments, the passive battery balancing circuitry and the EIS circuitry are part of an integrated circuit.

In some embodiments, the at least one stimulus signal is comprised of a square wave, a triangle wave, or a sine wave.

In accordance with some embodiments of the present disclosure, an example apparatus is provided. The apparatus may comprise: passive battery balancing circuitry configured to generate at least a first passive balancing signal to balance a first charge of a first battery cell and a second charge of a second battery cell of a plurality battery cells when the first charge and the second charge are different; wherein the passive battery balancing circuitry is further configured to provide the first passive balancing signal to an EIS circuitry; wherein the EIS circuitry is configured to receive the first passive balancing signal and to provide a stimulus signal based on the first passive balancing signal to at least one of the plurality of battery cells, receive a response signal from the at least one of the plurality of battery cells based on the stimulus signal, and to generate at least one output signal based on the response signal; and a battery management system configured to receive the at least one output signal and determine at least one impedance.

In some embodiments, the passive battery balancing circuitry is further configured to passively balance each charge of each battery cell of the plurality of battery cells.

In some embodiments, the battery management system is further configured to determine a state of health of at least one of the plurality of battery cells based on the at least one impedance.

In some embodiments, to generate the at least one output signal based on the at least one response signal the EIS circuitry is further configured to synchronously acquire at least one voltage signal based on the response signal and at least one current signal based on the response signal.

In some embodiments, the at least one impedance includes at least one impedance for each of the plurality of battery cells.

In some embodiments, the passive battery balancing circuitry and the EIS circuitry are part of an integrated circuit.

In some embodiments, the at least one stimulus signal is comprised of a square wave, a triangle wave, or a sine wave.

In accordance with some embodiments of the present disclosure, an example method is provided. The method may comprise: generating, with a passive battery balancing circuitry, at least a first passive balancing signal to balance a first charge of a first battery cell and a second charge of a second battery cell of a plurality battery cells when the first charge and the second charge are different; transmitting the first passive balancing signal from the passive battery balancing circuitry to an EIS circuitry; receiving, by the EIS circuitry, at least one passive balancing signal; generating, by the EIS circuitry, at least one stimulus signal based on the at least one passive balancing signal; transmitting, by the EIS circuitry, the at least one stimulus signal to at least one of the plurality of battery cells; receiving, by the EIS circuitry, at least one response signal from the at least one of the plurality of battery cells based on the at least one stimulus signal; generating, by the EIS circuitry, at least one output signal based on the at least one response signal; and determining, by a battery management system, at least one impedance based on the at least one output signal.

In some embodiments, passively balancing, by the passive battery balancing circuitry, each charge of each battery of the plurality of battery cells.

In some embodiments, determining, by the battery management system, a state of health of at least one of the plurality of battery cells based on the at least one impedance.

In some embodiments, the at least one impedance includes at least one impedance for each of the plurality of battery cells.

In some embodiments, the passive battery balancing circuitry and the EIS circuitry are part of an integrated circuit.

In some embodiments, the at least one stimulus signal is comprised of a square wave, a triangle wave, or a sine wave.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
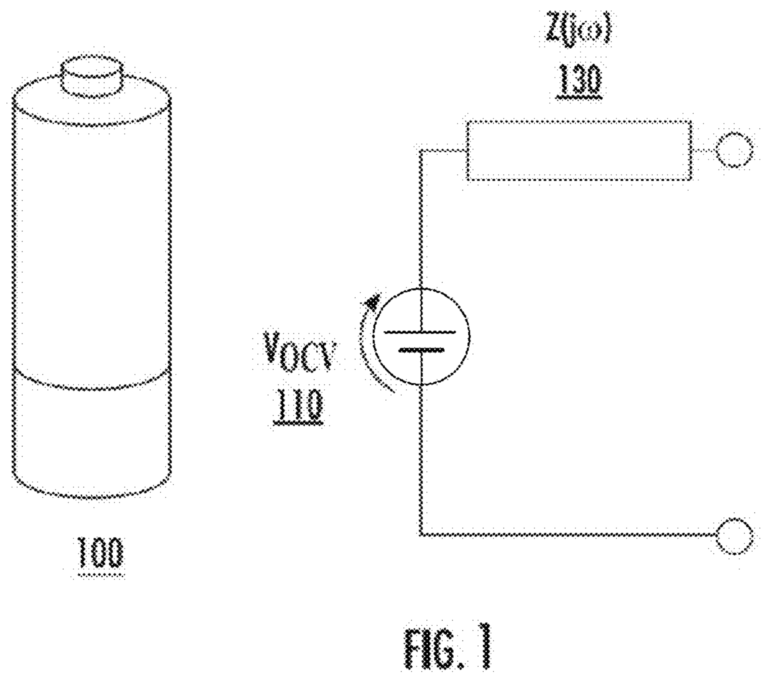
Figure 2:
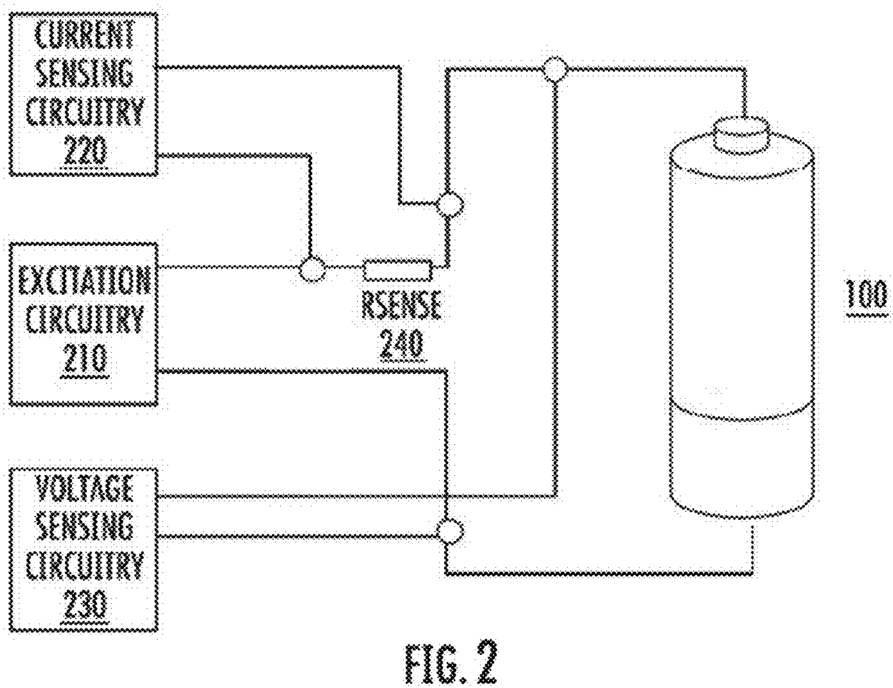
Figure 3:
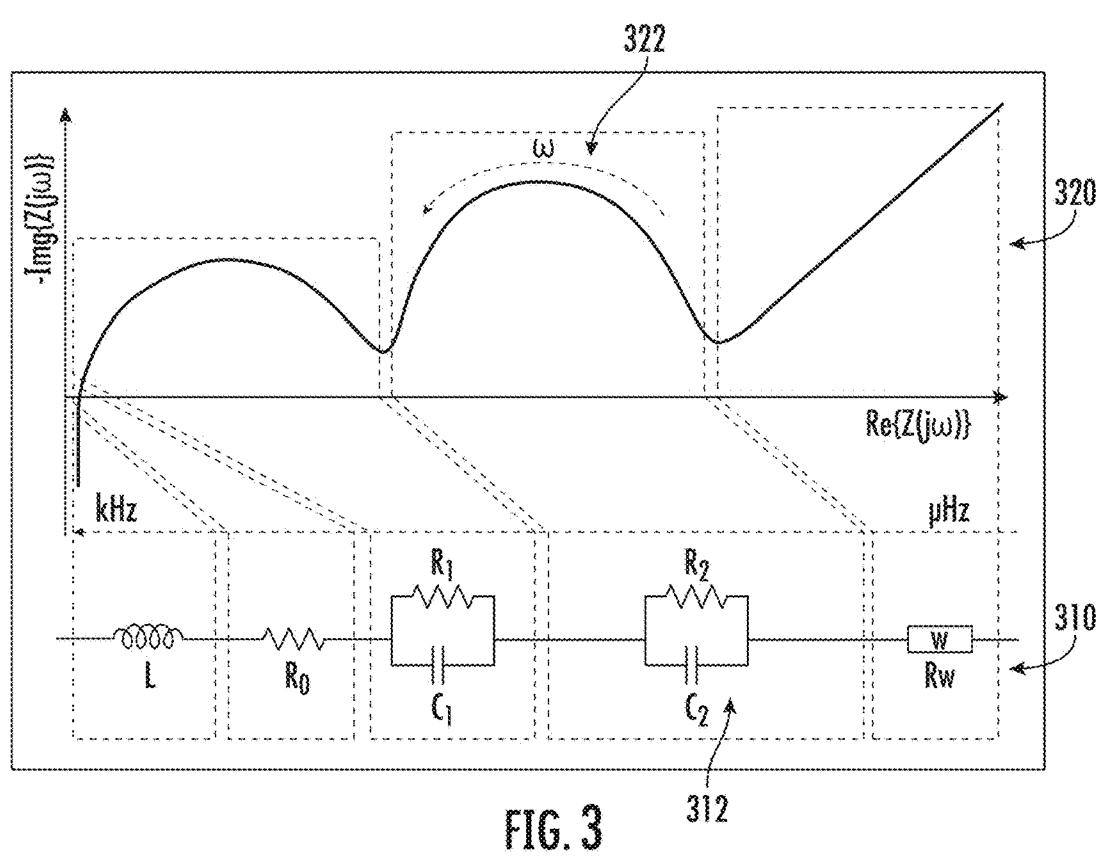
Figure 4:
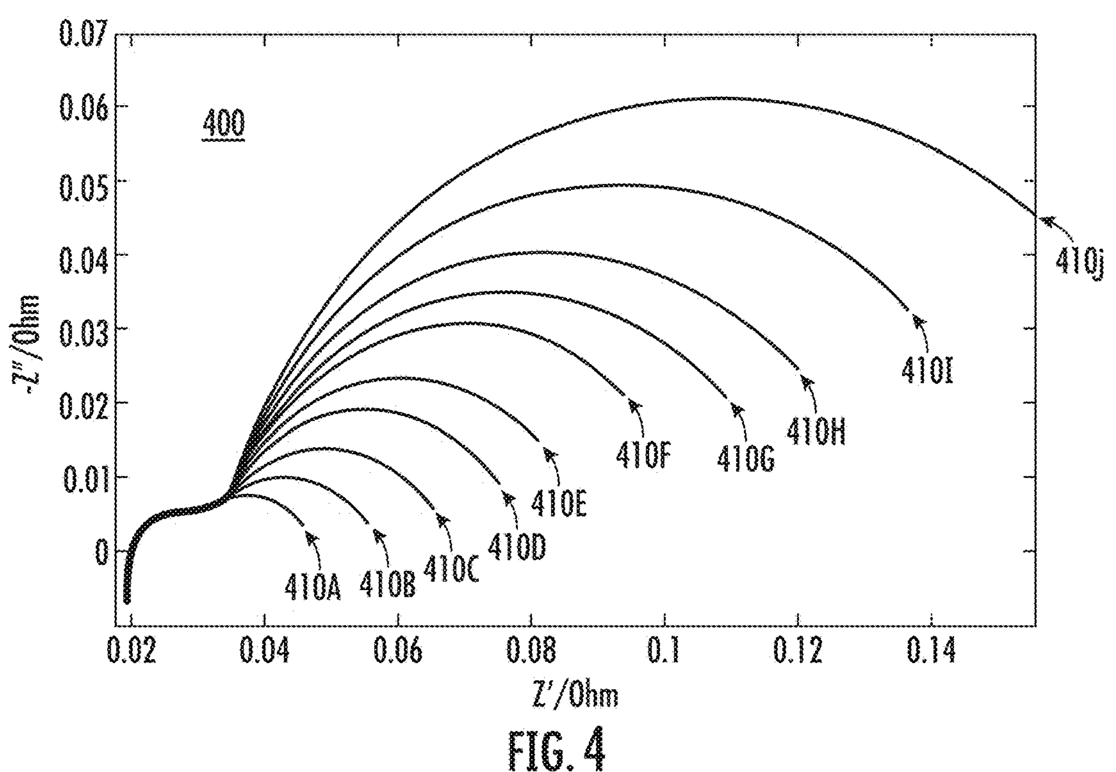
Figure 5:
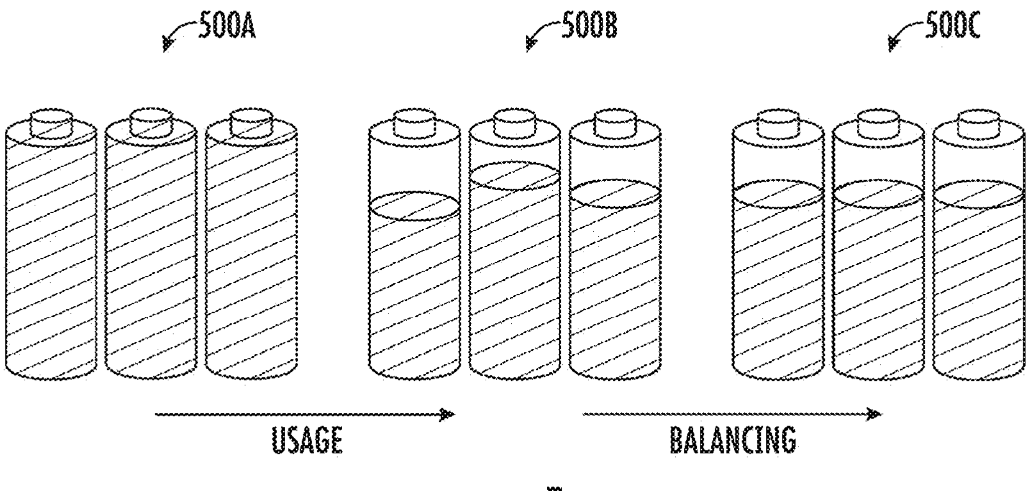
Figure 6:
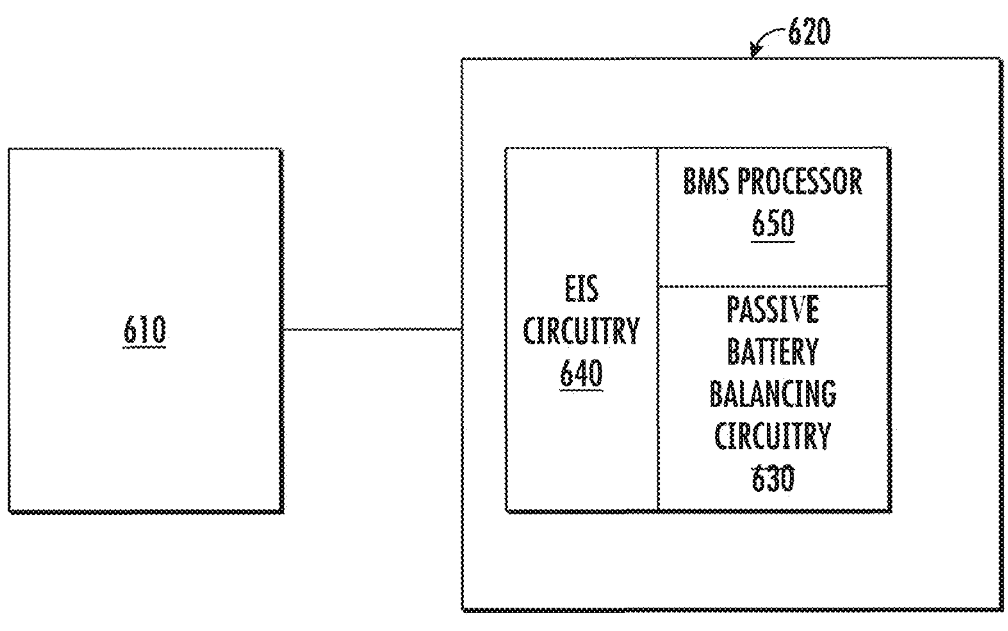
Figure 7:
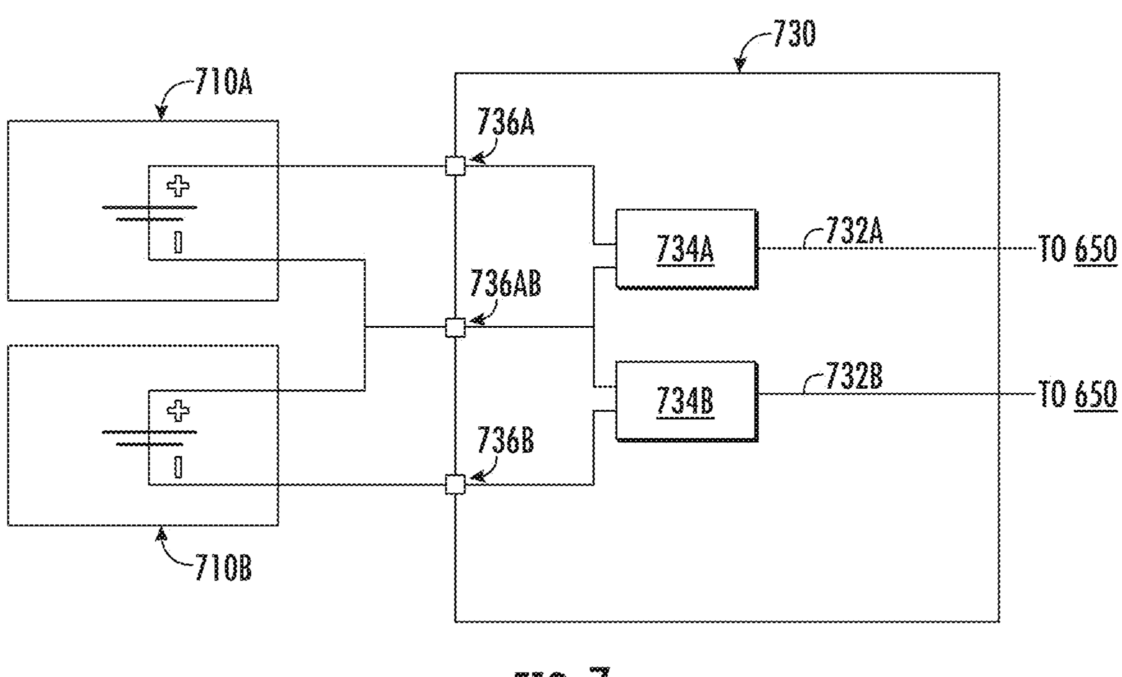
Figure 8:
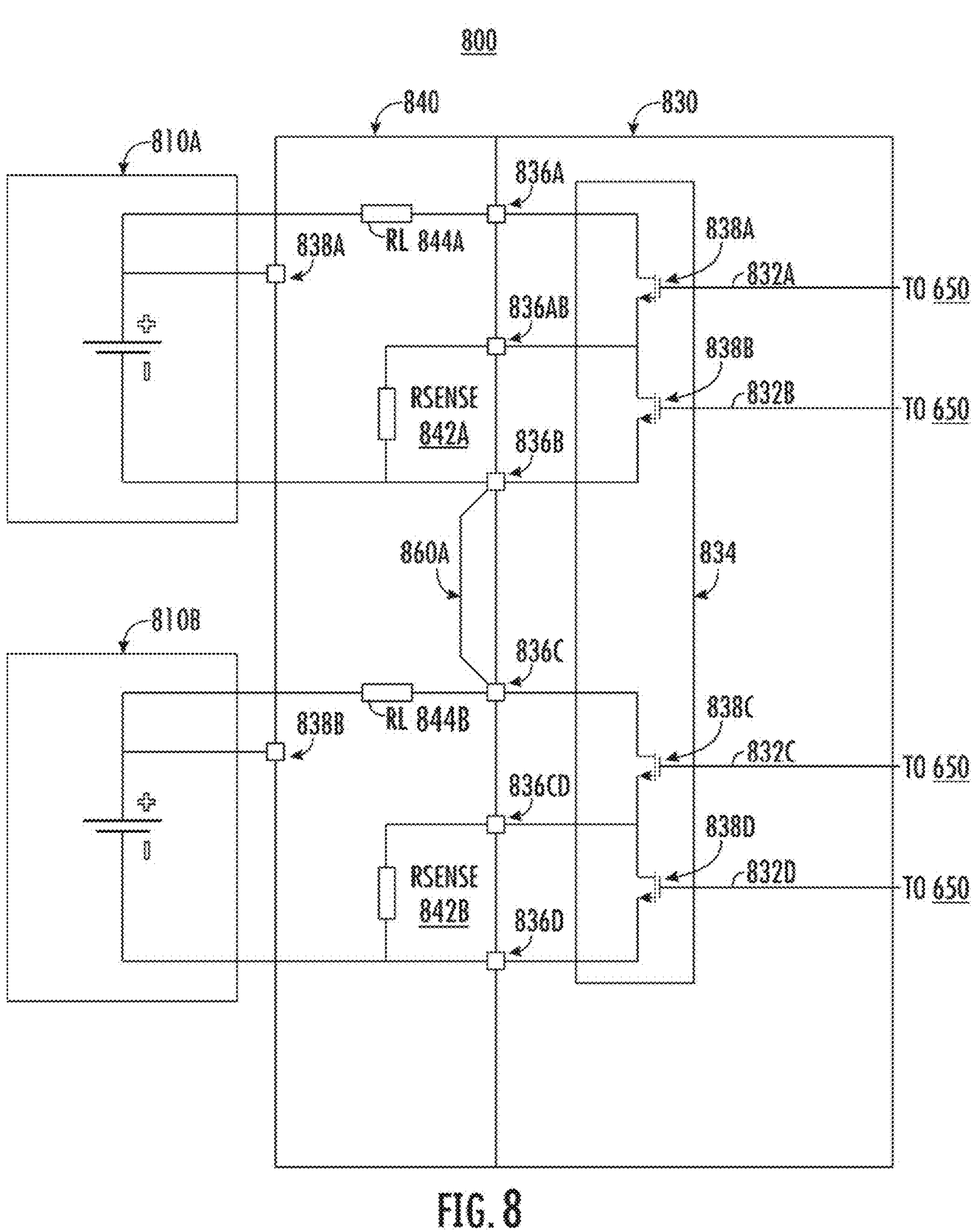
Figure 9:
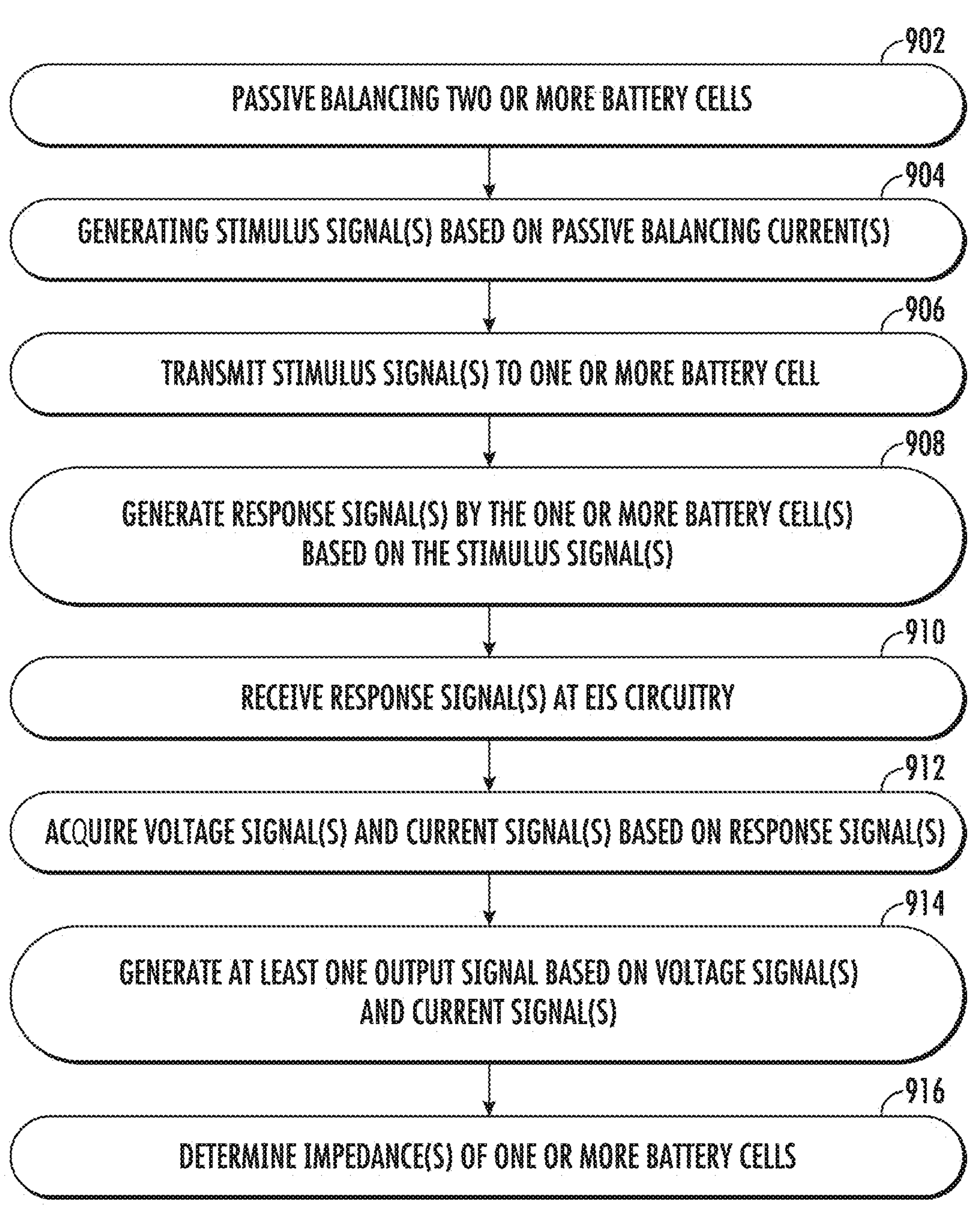
Figure 10:
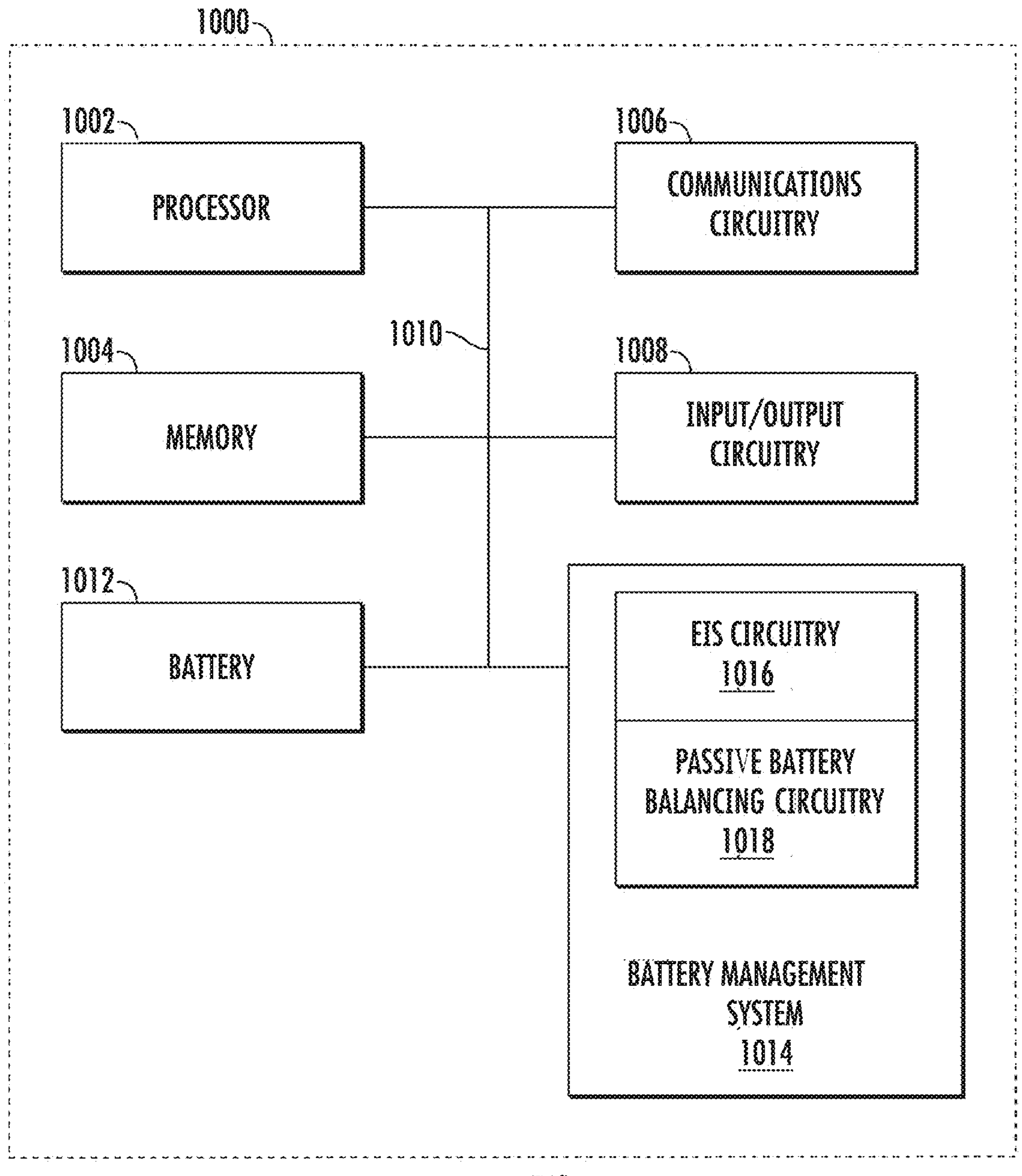

Having thus described certain example embodiments of the present disclosure in general terms, reference will now be made to the accompanying drawings, which are not necessarily drawn to scale, and wherein:

FIG. 1 illustrates an example battery and equivalent circuit in accordance with one or more embodiments of the present disclosure;

FIG. 2 illustrates an exemplary EIS circuitry in accordance with one or more embodiments of the present disclosure;

FIG. 3 illustrates an exemplary equivalent circuitry and associated impedance measurements in accordance with one or more embodiments of the present disclosure;

FIG. 4 illustrates an exemplary graph of impedance measurements in accordance with one or more embodiments of the present disclosure;

FIG. 5 illustrates an example of passive battery balancing in accordance with one or more embodiments of the present disclosure;

FIG. 6 illustrates an exemplary block diagram of circuitry for EIS measurements in accordance with one or more embodiments of the present disclosure;

FIG. 7 illustrates an example circuit diagram for passive battery balancing in accordance with one or more embodiments of the present disclosure;

FIG. 8 illustrates an example circuit diagram for circuitry for EIS measurements in accordance with one or more embodiments of the present disclosure;

FIG. 9 illustrates an exemplary flowchart of a first set of operations for generating an impedance in accordance with one or more embodiments of the present disclosure; and FIG. 10 illustrates an exemplary device in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

Various embodiments of the present disclosure are directed to improved systems, apparatuses, and methods for electrochemical impedance spectroscopy (EIS) for use with batteries, and particularly for a battery balancing circuit that may be used to generate a stimulus signal for EIS analysis of one or more batteries.

Batteries and battery balancing may be used in multiple applications, including automobiles (e.g., electric vehicles), appliances, battery storage systems, consumer electronics, and the like. In the applications battery management systems are used to monitor the health of batteries.

Battery cells may be out of balancing for one or more reasons. An imbalance between the charges of one or more battery cells may be due to differences in the internal resistances of the battery cells, each battery cell's respective capacity, battery cell temperatures, repeated charging cycles and/or discharging cycles with voltage equalization and/or ageing characteristics leading to a cell imbalances. Passive battery balancing operates on multiple battery cells (e.g., a multi-cell battery pack) by equalizing the charges on each battery cell to bring all of the multiple battery cells to the same charge level. In passive battery balancing the charge level may be to a minimum charge.

Without battery balancing, and during discharging, the battery pack may stop providing power when the lowest capacity battery cell or the overall battery capacity of the battery pack equals the lowest capacity battery cell of the battery pack. Thus an undercharged battery cell may cause the entire pack to have less power to provide or less lifetime. Additionally or alternative, without battery balancing, and during charging, a higher voltage battery cell may reach a full charge and will trip the battery pack to stop charging before lower charged battery cells are fully charged. Thus an overcharged battery cell may result in underutilization of the total potential of a battery pack.

The present disclosure provides for generating a stimulus signal to perform battery EIS from a battery balancing circuitry. In various embodiments, battery balancing circuitry may be passive battery balancing circuitry. The stimulus signal is used by EIS circuitry, which may be in a battery management system, to generate a response signal from a battery. The EIS circuitry synchronously generates a voltage signal and current signal based on the response signal. The voltage signal and the current signal are used to measure an impedance. EIS uses the impedance may be used to determine a state of health of the battery.

State of Health (SoH) indicates if a battery is healthy or aged and, thus, helps in preventing battery damage or, more simply, advising when it is time to replace a battery. SoH generally worsens over time with battery usage and charge/discharge cycles of the battery. EIS may also be used to estimate a battery's internal temperature, which may be used to identify and prevent dangerous thermal runaway. As a battery ages the impedance measurement of the second arc changes.

An exemplary embodiments includes an electric vehicle. For example, an electric vehicle may perform one or more passive balancing operations and may also, based on the passive balancing operations, excite the battery cells of the electric vehicle for measurements to be used for an EIS implementation. Various embodiments include performing EIS analysis when the battery is charging and/or discharging.

A stimulus signal generated by the passive battery balancing circuitry may be shaped by the passive battery balancing circuitry. In various embodiments, the stimulus signal may be a square wave, sine wave, triangle wave, etc. Additionally and/or alternatively, the passive battery balancing circuitry may vary the frequency of the stimulus signal. In various embodiments, the passive battery balancing circuitry may contain a plurality of FETs (e.g., MOSFETS) that may be used to shape the stimulus signal that will excite the battery. The passive battery balancing circuitry may be used to generate the stimulus signal.

Utilizing the passive battery balancing circuitry to generate the stimulus signal may provide multiple improvements, including but not limited to reducing the circuitry required to perform EIS analysis of the battery, reducing the physical footprint of the integrated circuit, and/or reducing cost. Additionally or alternatively, embodiments in accordance with the present disclosure may utilize a waveform produced by a passive battery balancing circuitry as a stimulus signal to provide to the battery. Thus, the present disclosure reuses energy associated with passive battery balancing as a stimulus signal. The energy, circuitry, and cost associated and/or required by conventional EIS systems may be reduced. This increases the efficiency of the overall system by reusing some of this lost energy to generate EIS measurements.

Passive battery balancing circuitry performs one or more operations for balancing the battery cells. In various embodiments, the passive battery balancing circuitry and EIS circuitry may be a part of a battery management system. In various embodiments, the battery management system may be on an integrated circuit.

Exemplary Systems, Apparatuses, and Methods

FIG. 1 illustrates an example battery and equivalent circuit in accordance with one or more embodiments of the present disclosure. A battery 100 has a battery chemistry that is associated with an equivalent circuit comprised of a voltage source 110, a current, and an impedance 130. The impedance 130 may be measured based on the voltage of voltage source 110 and current.

EIS measurements may be performed during both charging and discharging of a battery. A voltage measurement may be V(t) of the equivalent voltage source 110, which is illustrated as an open circuit voltage $V_{OCV}$. A current measurement may be I(t) of the equivalent current through an impedance 130 Z(jω). Measurements of the voltage V(t) and current I(t) may be used to evaluate the impedance 130 Z(jω) of the battery 100.

While battery 100 is illustrated as a single battery, a battery 100 may include multiple battery cells. An impedance 130 may be measured at each battery cell, all battery cells collectively, or as one or more groupings of multiple battery cells.

FIG. 2 illustrates an exemplary EIS circuitry in accordance with one or more embodiments of the present disclosure. The EIS circuitry may comprise, among other things, an excitation circuitry 210, a current sensing circuitry 220, a voltage sensing circuitry 230, and a sensing resistor 240. The EIS circuitry may be electrically connected to at least one battery 100.

The EIS circuitry includes multiple analog circuitry and/or circuitry components to minimize the digital computation required. In various embodiments, the EIS circuitry also includes an EIS processor in addition to the analog circuits. The EIS processor (e.g., a MCU) may interface with a battery management system (BMS).

The EIS circuitry measures current and voltage of a response of the battery to a stimulus signal. The stimulus signal is generated by an excitation circuitry 210.

The excitation circuitry 210 generates the stimulus signal and provides it to the battery 100 and a response signal is measured for both current and voltage. The voltage and current measurements may be synchronously acquired for use in generating one or more signals for generating an impedance 130. The current is measured across a sensing resistor 240, which is illustrated as RSENSE 240. The current is measured with current sensing circuitry 220 to generate a current signal. The voltage is measured based on the stimulus signal and the response signal. The voltage is measured with voltage sensing circuitry 230 to generate a voltage signal. These voltage and current measurements are used to determine impedance.

FIG. 3 illustrates an exemplary equivalent circuitry and associated impedance measurements in accordance with one or more embodiments of the present disclosure. Various portions of a battery (e.g., chemical and/or physical portions or aspects) may have different electrical component equivalents. It will be appreciated that FIG. 3 is illustrative and may not be to size and/or various portions of the impedance may be associated with other models that include one or more electrical components. These different electrical component equivalents are associated with the impedance measurements. The exemplary equivalent circuitry 310 associated with the impedance 130 of a battery 100 varies with frequency. For example, the equivalent circuitry of the impedance may be an inductor (L), a first resistor ($R_0$), a second resistor ($R_1$) in parallel with a first capacitor ($C_1$), a third resistor ($R_2$) in parallel with a second capacitor ($C_2$), and a resistor ($R_W$), which is referred to in FIG. 3 with reference number 312. For EIS measurements, the values of the impedance of the third resistor ($R_2$) in parallel with the second capacitor ($C_2$), which is referred to as 322, is used as these values change as a battery ages or is damaged.

The top portion of FIG. 3 is a graph 320 of the positive real portion of an impedance on the x-axis and a negative imaginary portion of the impedance on the y-axis. The y-axis using the negative imaginary portion of the impedance 322 is due to the capacitor in the equivalent model as capacitors have a negative imaginary impedance. The change in the impedance 322 over time may be graphed, which may demonstrate how the impedance 322 changes with age and/or damage.

FIG. 4 illustrates an exemplary graph of impedance measurements in accordance with one or more embodiments of the present disclosure. A graph 400 includes measurements of the impedance, including impedance 322, of a battery 100 over time after different numbers of cycles.

The graph 400 is of a Nyquist diagram that includes 10 impedances as measured for a battery 100 after 10 periods of 100 cycles.

The first impedance 410A is after 100 cycles.
The second impedance 410B is after 200 cycles.
The third impedance 410C is after 300 cycles.
The fourth impedance 410D is after 400 cycles.
The fifth impedance 410E is after 500 cycles.
The sixth impedance 410F is after 600 cycles.
The seventh impedance 410G is after 700 cycles.
The eighth impedance 410H is after 800 cycles.
The ninth impedance 410I is after 900 cycles.
The tenth impedance 410J is after 1000 cycles.

As illustrated in FIG. 4, the aging of a battery 100 through cycling increases the impedance 322 from 100 cycles (e.g., 410A) to 1000 cycles (e.g., 410J). Specifically, the arc of impedance 322, which is the second arc, widens with aging. As illustrated, the impedance is measured at a plurality of frequencies, such as with a frequency sweep. In various embodiments, the frequency sweep may be performed by varying the frequency of the stimulus signal provided to a battery 100. By determining impedance measurements the state of health of the battery may be determined.

Battery balancing, including passive battery balancing, may increase the performance of a battery pack. In various embodiments, the weakest battery cell among the plurality of battery cells may determine the battery pack's overall capacity. Battery balancing improves the battery pack's overall capacity and/or potential, the cell's longevity, and ensures that all of the battery pack's energy is available.

FIG. 5 illustrates an example of passive battery balancing in accordance with one or more embodiments of the present disclosure. During passive balancing of battery cells the charge on each of the battery cells may be balanced. In various embodiments, the cells of a battery pack may each be fully charged (e.g., 500A). When a battery pack is installed and subjected to charging and/or discharging, the individual battery cells' voltages may vary. This variation may cause battery cell imbalance over a period of time (e.g., 500B). Passive balancing of the battery cells may be done to discharge the battery cells so that the charge of each battery cell is the same (e.g., 500C). So battery cell balance is a state in which all the individual cells in have the same capacity and/or voltage.

Battery balancing circuitry addresses the different voltages and/or charges that may be in the battery cells and redistribute the charge. While any one battery cell may have more or less power, a passive battery balancing circuitry performing one or more passive balancing operations may passively balance the charge of some or all of the battery cells. The passive battery balancing circuitry determines an imbalance between battery cells and then reduces the charge on each of the battery cells that exceed the minimum one.

In various embodiments, the passive battery balancing circuitry generates a stimulus signal (a.k.a. excitation signal) that will be used by EIS circuitry to stimulate the battery to generate a response signal. The stimulus signal may be generated based on an unbalancing of one or more battery cells. These currents may be used to generate the excitation signal.

FIG. 6 illustrates an exemplary block diagram of circuitry for EIS measurements in accordance with one or more embodiments of the present disclosure. A battery management circuitry 620 may include battery balancing circuitry 630, EIS circuitry 640, and a battery management system (BMS) processor 650. The passive battery balancing circuitry 630 may also include active battery balancing circuitry. The battery management circuitry 620 may generate a stimulus signal to stimulate a battery 610, which causes the battery 610 to generate a response signal that is provided to the battery management circuitry 620.

In various embodiments, the passive battery balancing circuitry 630 may be configured with excitation circuitry that may configured to generate one or more stimulus signals to stimulate and/or excite one or more batteries. The excitation circuitry may include one or more signal generator(s) (e.g., a sine-wave signal generator, a square-wave signal generator, or the like) to generate one or more stimulus signal(s). The circuitry that generates one or more current for balancing the battery 610 may also be the excitation circuitry.

In various embodiments, there may be excitation circuitry to generate a stimulus signal that may stimulate each of the battery cells or one or more groupings of the battery cells. For example, the excitation circuitry may contain one signal generators to generate the stimulus signal(s). Alternatively or additionally, the excitation circuitry may generate a separate stimulus signal for each of the battery cells. For example, the excitation circuitry may contain multiple signal generators to generate multiple, respective, stimulus signals. In various embodiments, a signal generator may generate one or more stimulus signals at one or more frequencies. Stimulus signals of multiple frequencies may be provided to a battery cell to generate response signals at the multiple frequencies.

An EIS measurement may be performed one the response signal that is generated by the battery based on the stimulus signal(s). The EIS circuitry 640, receiving the response signal(s), may synchronously generate a voltage signal and a current signal for each respective response signal. Based on these voltage signal and a current signal, the EIS circuitry may generate at least one output signal associated with an impedance measurement. In various embodiments, the at least one output signal may include a phase angle, a time period, an amplitude, and/or a phase and amplitude based on the voltage signal and current signal and associated with an impedance. The impedance may be determined based on these at least one output signals, such as by an EIS processor, a BMS processor 650, or the like.

FIG. 7 illustrates an example circuit diagram for battery balancing in accordance with one or more embodiments of the present disclosure.

The passive battery balancing circuitry 730 may include a plurality of balancing switching circuitry 734 that may be controlled by one or more balancing control signals 732. The balancing control signals 732 may be provided from and/or to a BMS processor 650. In various embodiments, a balancing switching circuitry 734 may include, but is not limited to, switches, transistors (e.g., MOSFET), drivers, resistors, capacitors, and the like. The multiple balancing switching circuitries 734 (e.g., 734A, 734B) may be operated to balance the charge of the battery cells by discharging the battery cells with a higher charge.

In FIG. 7, a first balancing switching circuitry 734A is electrically connected to a first terminal 736A and a second terminal 736AB. A second balancing switching circuitry 734B is electrically connected to the second terminal 736AB and a third terminal 736B. A first battery cell 710A is electrically connected to the first terminal 736A and the second terminal 736AB. A second battery cell is electrically connected to the second terminal 736AB and the third terminal 736C. By operating the passive battery balancing circuitry 730, including the balancing switching circuitry 734A, 734B, one or more balancing operations may be performed to discharging either the first battery cell 710A or second battery cell 710B.

While not illustrated, there may be one or more additional electrical connections between the battery cells 710 and the battery management circuitry 620, such as passive battery balancing circuitry 730, for connecting the battery cells 710 to one or more loads. In this manner the battery cells 710 may be controlled or monitored for connecting to one or more loads (e.g., motors) or other systems of a device, which may depend on the application of the device (e.g., electric vehicle has other systems).

In various embodiments, the passive battery balancing circuitry 730 may include one or more resistors to limit the current flowing between the battery cells 710A, 710B during charging and/or discharging. For example, the balancing switching circuitry 734 may include a MOSFET that may be limited in the amount of current it may pass when being used a switch and one or more resistors may reduce the current during battery balancing.

While the balancing switching circuitry 734 is illustrated internal to the passive balancing circuitry 730, which may be internal to a BMS circuitry 620, some of a balancing switching circuitry 734 (e.g., MOSFET, resistors, etc.) may be located external to the BMS circuitry 620.

While FIG. 7 illustrates two battery cells 710A, 710B and passive battery balancing circuitry 730 have balancing switching circuitry 734A, 734B for these two battery cells 710A, 710B, it will be appreciated that present disclosure readily addresses additional battery cells by increasing the number of battery cells 710 and the balancing switching circuitry 734.

FIG. 8 illustrates an example circuit diagram for circuitry for EIS measurements in accordance with one or more embodiments of the present disclosure.

A battery management circuitry 800 may include passive battery balancing circuitry 830 and EIS circuitry 840. The passive battery balancing circuitry 830 may be used in conjunction with the EIS circuitry 840 to generate one or more stimulus signals to provide to one or more battery cells 810 and to measure one or more response signals from the one or more battery cells 810. For example, the passive battery balancing circuitry may generate a first stimulus signal for a first battery cell 810A and generate a second stimulus signal for a second battery cell 810B.

In various embodiments, the EIS circuitry 840 may include multiple resistors, including but not limited to, for each battery cell, a Rsense resistor 842 and a RL resistor 844.

For a battery cell 810, a Rsense resistor 842 and the RL resistor 844 may be used to generate voltage measurements. For example, voltage sensing circuitry 230 and/or current sensing circuitry 220 may, respectively, generate voltage and/or current measurements across these resistors to generate a voltage signal and/or current signal as described herein.

In various embodiments, by measuring the voltages across a Rsense resistor 842 and RL resistor 844 a voltage for the battery cell 710A may be determined, such as with summing circuitry, digital measurements, or the like.

In various embodiments, a battery cell 810 may have one or more additional electrical connections to the battery management circuitry 620, such as a terminal 838 (e.g., 838A, 838B) that electrically connects a polarity of the battery cell 710A to a load. It will be appreciated that while only one of these electrical connections is illustrated that each battery cell 810 may have such an electrical connection from each terminal of the battery cell 810 to allow for electrically connecting the battery cell 810 to one or more loads. Such connections (e.g., 838A) may be used to measure the voltage across resistor $R_L$ 844A.

For example, for a first battery cell 810A the voltage sensing circuitry may measure a first voltage across $R_L$ 844A at terminals 836A and 838A and a second voltage across Rsense 842A at terminals 836AB and 836B. Adding this first voltage and second voltage provides the voltage of the battery 810A. The voltage sensing circuitry may generate a voltage signal associated with the response signal of the battery 810A for use in EIS measurements as described herein.

A current may be measured current sensing circuitry 220 by measuring the current across Rsense resistor 842. The current sensing circuitry may generate a current signal associated with the response signal of the battery 810A for use in EIS measurements as described herein.

Additionally batteries (e.g., a second battery 810B) may be provided a stimulus signal and similarly generate a response signal, which may be similarly measured by the current sensing circuitry 220 and voltage sensing circuitry 230. A connector 860A may connect two terminals together, which may provide for passive balancing signals to be provided to the batteries as described herein.

During passive balancing operations, the passive battery balancing circuitry 830 may receive one or more control signals, such as from a processor (e.g., BMS processor 650). The one or more control signals may be received at balancing switching circuitry 834. In response to receiving the control signals the balancing switching circuitry 834 may be operated to generate one or more passive balancing signals. In various embodiments, the balancing circuitry 834 may be comprised of one or more FETS 838 (e.g., 838A, 838B) that may be operated to generate a passive balancing signal.

In various embodiments the passive balancing signal may also be a stimulus signal that may be provided to EIS circuitry 840 and a one or more batteries 810.

For example, balancing circuitry 834 may be operate a first FET 838A and a second FET 838B to generate a first passive balancing signal that is also a first stimulus signal. This first stimulus signal may be provided to EIS circuitry 840 via one or more terminals (e.g., 836A, 836AB, 836B). The EIS circuitry may provide the first stimulus signal to the battery 810A to generate a first response signal. The response signal may be measured by current sensing circuitry 220 and voltage sensing circuitry 230.

Similarly, balancing circuitry 834 may be operate a third FET 838C and a fourth FET 838D to generate a second passive balancing signal that is also a second stimulus signal. This second stimulus signal may be provided to EIS circuitry 840 via one or more terminals (e.g., 836C, 836CD, 836D). The EIS circuitry may provide the second stimulus signal to the battery 810B to generate a second response signal. The second response signal may be measured by current sensing circuitry 220 and voltage sensing circuitry 230.

Various embodiments may additionally include excitation circuitry 210 in the EIS circuitry. The excitation circuitry 210 may include, among other things, one or more electrical components that may adjust or modify the stimulus signal. For example, one or more filters may be provided.

FIG. 9 illustrates an exemplary flowchart of a first set of operations for generating an impedance in accordance with one or more embodiments of the present disclosure.

At operation 902, passively balance two or more battery cells. Passive battery balancing circuitry may be used to determine that the charge of one or more of multiple battery cells are different. The passive battery balancing circuitry may operate to generate at least one passive balancing signal to passively balancing the battery cells so that one or more of the battery cells have the same charge. In various embodiments that are passively charging more than one battery cell, multiple passive balancing signals may be generated with each battery cell being discharged being associated with a passive balancing signal. In various embodiments, the passive balancing signal may be generated at a specific frequencies or various frequencies and with a specific waveform or with multiple waveforms that may change over time.

At operation 904, generate stimulus signal(s) based on passive balancing signal(s). The passive balancing signal(s) may be transmitted to EIS circuitry. The EIS circuitry generates one or more stimulus signals based on the one or more passive balancing signals. Alternatively or additionally, one or more passive balancing signals may be stimulus signals. A stimulus signal may be generated based on passive balancing signal, which may include summing one or more passive balancing signals, filtering a passive balancing signal, and/or superimposing another signal at one or more different frequencies onto the passive balancing signal.

At operation 906, transmit the stimulus signal(s) to one or more battery cells. The stimulus signal(s) may be transmitted to the battery(ies). In various embodiments where a passive balancing signal, without adjustment, is a stimulus signal then the passive balancing signal may be provided to a battery without adjustment.

At operation 908, generate response signal(s) by the one or more battery cells based on the stimulus signal(s). A battery will generate a response signal based on the stimulus signal. The response signal may vary from the stimulus signal as described herein. In various embodiments with multiple battery cells being provided stimulus signals, each battery may provide a separate response signal.

At operation 910, receive response signal(s) at EIS circuitry. A response signal is received by the EIS circuitry from the battery. The response signal 214 is in response to the stimulus signal provided to the battery. The response signal may be based on the stimulus signal but will be adjusted based on the battery, such as based on the battery chemistry of the battery.

At operation 912, acquire voltage signal(s) and current signal(s) based on response signal(s). A current sensing circuitry 220 of the EIS circuitry may acquire the current signal based on the response signal. The current signal is based on the current of the response signal measured across a sensing resistor 240, which may acquire a current signal that is proportional to the current measured. A voltage sensing circuitry 230 may acquire the voltage signal based on the response signal and the stimulus signal. A voltage sensing circuitry 230 of the EIS circuitry may acquire a voltage signal based on the response signal 214 and the stimulus signal 212. The voltage signal is based on the voltage measured between these two signals, which may acquire a voltage signal that is proportional to the voltage measured.

At operation 914, generate at least one output signal based on the voltage signal(s) and current signal(s). Based on the current signal and the voltage signal, the EIS circuitry may generate at least one output signal. In various embodiments the at least one output signal may include one or more of a phase signal, an amplitude signal, or a phase and amplitude signal. Such output signals may be signals that are proportional to a phase, amplitude, and/or amplitude and phase of an impedance.

At operation 916, determine impedance(s) of one or more batteries. The at least one output signal(s) may be provided to a battery management system that may determine an impedance(s) based on the at least one output signals. In various embodiments, the at least one output signals are proportional to the phase, amplitude, and/or amplitude and phase of an impedance. The battery management system may, for example, use a look-up table to determine an impedance value(s) associated with the at least one output signal(s). In various embodiments, multiple output signals are generated via multiple stimulus signals, including from stimulus signals at varying frequencies. For example, one or more stimulus signals may perform a frequency sweep for stimulated the battery 100.

FIG. 10 illustrates an exemplary device in accordance with one or more embodiments of the present disclosure. The device 1000 may be a device for an application and/or a system. For example, the device 1000 may be a power tool, electric vehicle, consumer electronics, or the like. The device 1000 illustrated may be a system and/or apparatus that includes a processor 1002, memory 1004, communications circuitry 1006, input/output circuitry 1008, battery 1012, passive battery management system 1014, EIS circuitry 1016, and all of which may be connected by a bus or buses 1010. While such connections are illustrated as bus 1010, it will be readily appreciated that there may be multiple other connections.

The processor 1002, although illustrated as a single block, may be comprised of a plurality of components and/or processor circuitry. The processor 1002 may be implemented as, for example, various components comprising one or a plurality of microprocessors with accompanying digital signal processors; one or a plurality of processors without accompanying digital signal processors; one or a plurality of coprocessors; one or a plurality of multi-core processors; processing circuits; and various other processing elements. The processor may include integrated circuits. In various embodiments, the processor 1002 may be configured to execute applications, instructions, and/or programs stored in the processor 1002, memory 1004, or otherwise accessible to the processor 1002. When executed by the processor 1002, these applications, instructions, and/or programs may enable the execution of one or a plurality of the operations and/or functions described herein. Regardless of whether it is configured by hardware, firmware/software methods, or a combination thereof, the processor 1002 may comprise entities capable of executing operations and/or functions according to the embodiments of the present disclosure when correspondingly configured.

The memory 1004 may comprise, for example, a volatile memory, a non-volatile memory, or a certain combination thereof. Although illustrated as a single block, the memory 1004 may comprise a plurality of memory components. In various embodiments, the memory 1004 may comprise, for example, a random access memory, a cache memory, a flash memory, a hard disk, a circuit configured to store information, or a combination thereof. The memory 1004 may be configured to write or store data, information, application programs, instructions, etc. so that the processor 1004 may execute various operations and/or functions according to the embodiments of the present disclosure. For example, in at least some embodiments, a memory 1004 may be configured to buffer or cache data for processing by the processor 1002. Additionally or alternatively, in at least some embodiments, the memory 1004 may be configured to store program instructions for execution by the processor 1002. The memory 1004 may store information in the form of static and/or dynamic information. When the operations and/or functions are executed, the stored information may be stored and/or used by the processor 1002.

The communication circuitry 1006 may be implemented as a circuit, hardware, computer program product, or a combination thereof, which is configured to receive and/or transmit data from/to another component or apparatus. The computer program product may comprise computer-readable program instructions stored on a computer-readable medium (e.g., memory 1004) and executed by a processor 1002. In various embodiments, the communication circuitry 1006 (as with other components discussed herein) may be at least partially implemented as part of the processor 1002 or otherwise controlled by the processor 1002. The communication circuitry 1006 may communicate with the processor 1002, for example, through a bus 1010. Such a bus 1010 may connect to the processor 1002, and it may also connect to one or more other components of the processor 1002. The communication circuitry 1006 may be comprised of, for example, transmitters, receivers, transceivers, network interface cards and/or supporting hardware and/or firmware/software, and may be used for establishing communication with another component(s), apparatus(es), and/or system(s). The communication circuitry 1006 may be configured to receive and/or transmit data that may be stored by, for example, the memory 1004 by using one or more protocols that can be used for communication between components, apparatuses, and/or systems.

The input/output circuitry 1008 may communicate with the processor 1002 to receive instructions input by an operator and/or to provide audible, visual, mechanical, or other outputs to an operator. The input/output circuitry 1008 may comprise supporting devices, such as a keyboard, a mouse, a user interface, a display, a touch screen display, lights (e.g., warning lights), indicators, speakers, and/or other input/output mechanisms. The input/output circuitry 1008 may comprise one or more interfaces to which supporting devices may be connected. In various embodiments, aspects of the input/output circuitry 1008 may be implemented on a device used by the operator to communicate with the processor 1002. The input/output circuitry 1008 may communicate with the memory 1004, the communication circuitry 1006, and/or any other component, for example, through a bus 1010.

A battery 1012 may provide power to the device 1000. In various embodiments, the battery 1012 may be multiple battery cells, which may form one or more battery packs.

The battery management system 1014 may include EIS circuitry 1016 and passive battery balancing circuitry 1018. The EIS circuitry 1016 may include one or more dedicated processors, one or more dedicated memories, and/or additional electrical components. In various embodiments the EIS circuitry 1016 may be configured as described herein and configured to perform one or more operations as described herein. The passive battery balancing circuitry 1018 may be configured as described herein and configured to perform one or more operations as described herein. For example, the passive battery balancing circuitry 1018 may generate one or more passive balancing signals. The passive balancing signals may be transmitted to the EIS circuitry, which may then adjust and/or transmit the passive balancing signal as a stimulus signal to a battery. In response the EIS circuitry may receive a response signal. The EIS circuitry may generate one or more output signals based on the response signal, which may be provided to the battery management system 1014 to determine and/or measure an impedance of the battery 1012. In various embodiments, the impedance of the battery 1012 may be determined via a look-up table based on the output signal(s) of the EIS circuitry 1016. This impedance of the battery 1012 may be used by the battery management system 1014 to determine, among other things, a state of health of the battery. The device 1000 may generate or perform one or more operations based on the state of health of the battery 1012, such as cease battery operations, shut down the device 1000, generate, display, and/or transmit a warning message, and the like.

It should be readily appreciated that the embodiments of the systems and apparatuses, described herein may be configured in various additional and alternative manners in addition to those expressly described herein.

CONCLUSION

Operations and/or functions of the present disclosure have been described herein, such as in flowcharts. As will be appreciated, computer program instructions may be loaded onto a computer or other programmable apparatus (e.g., hardware) to produce a machine, such that the resulting computer or other programmable apparatus implements the operations and/or functions described in the flowchart blocks herein. These computer program instructions may also be stored in a computer-readable memory that may direct a computer, processor, or other programmable apparatus to operate and/or function in a particular manner, such that the instructions stored in the computer-readable memory produce an article of manufacture, the execution of which implements the operations and/or functions described in the flowchart blocks. The computer program instructions may also be loaded onto a computer, processor, or other programmable apparatus to cause a series of operations to be performed on the computer, processor, or other programmable apparatus to produce a computer-implemented process such that the instructions executed on the computer, processor, or other programmable apparatus provide operations for implementing the functions and/or operations specified in the flowchart blocks. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. A system comprising:

a plurality of battery cells, including at least a first battery cell and a second battery cell, wherein the first battery cell has a first charge and the second battery cell has a second charge;

passive battery balancing circuitry configured to generate at least a first passive balancing signal to balance the first charge of the first battery cell and the second charge of the second battery cell when the first charge and the second charge are different;

wherein the passive battery balancing circuitry is further configured to provide the first passive balancing signal to an EIS circuitry;

wherein the EIS circuitry is configured to receive the first passive balancing signal and to provide a stimulus signal based on the first passive balancing signal to at least one of the plurality of battery cells, receive a response signal from the at least one of the plurality of battery cells based on the stimulus signal, and to generate at least one output signal based on the response signal; and a battery management system configured to receive the at least one output signal and determine at least one impedance.

2. The system of claim 1, wherein the passive battery balancing circuitry is further configured to passively balance each charge of each battery cell of the plurality of battery cells.

3. The system of claim 1, wherein the battery management system is further configured to determine a state of health of at least one of the plurality of battery cells based on the at least one impedance.

4. The system of claim 1, wherein to generate the at least one output signal based on the response signal the EIS circuitry is further configured to synchronously acquire at least one voltage signal based on the response signal and at least one current signal based on the response signal.

5. The system of claim 1, wherein the at least one impedance includes at least one impedance for each of the plurality of battery cells.

6. The system of claim 1, wherein the passive battery balancing circuitry and the EIS circuitry are part of an integrated circuit.

7. The system of claim 1, wherein the stimulus signal is comprised of a square wave, a triangle wave, or a sine wave.

8. An apparatus comprising:

passive battery balancing circuitry configured to generate at least a first passive balancing signal to balance a first charge of a first battery cell and a second charge of a second battery cell of a plurality of battery cells when the first charge and the second charge are different;

wherein the passive battery balancing circuitry is further configured to provide the first passive balancing signal to an EIS circuitry;

wherein the EIS circuitry is configured to receive the first passive balancing signal and to provide a stimulus signal based on the first passive balancing signal to at least one of the plurality of battery cells, receive a response signal from the at least one of the plurality of battery cells based on the stimulus signal, and to generate at least one output signal based on the response signal; and a battery management system configured to receive the at least one output signal and determine at least one impedance.

9. The apparatus of claim 8, wherein the passive battery balancing circuitry is further configured to passively balance each charge of each battery cell of the plurality of battery cells.

10. The apparatus of claim 8, wherein the battery management system is further configured to determine a state of health of at least one of the plurality of battery cells based on the at least one impedance.

11. The apparatus of claim 8, wherein to generate the at least one output signal based on the response signal the EIS circuitry is further configured to synchronously acquire at least one voltage signal based on the response signal and at least one current signal based on the response signal.

12. The apparatus of claim 8, wherein the at least one impedance includes at least one impedance for each of the plurality of battery cells.

13. The apparatus of claim 8, wherein the passive battery balancing circuitry and the EIS circuitry are part of an integrated circuit.

14. The apparatus of claim 8, wherein the stimulus signal is comprised of a square wave, a triangle wave, or a sine wave.

15. A method comprising:

generating, with a passive battery balancing circuitry, at least a first passive balancing signal to balance a first charge of a first battery cell and a second charge of a second battery cell of a plurality of battery cells when the first charge and the second charge are different;

transmitting the first passive balancing signal from the passive battery balancing circuitry to an EIS circuitry;

receiving, by the EIS circuitry, at least one passive balancing signal;

generating, by the EIS circuitry, at least one stimulus signal based on the at least one passive balancing signal;

transmitting, by the EIS circuitry, the at least one stimulus signal to at least one of the plurality of battery cells;

receiving, by the EIS circuitry, at least one response signal from the at least one of the plurality of battery cells based on the at least one stimulus signal;

generating, by the EIS circuitry, at least one output signal based on the at least one response signal; and determining, by a battery management system, at least one impedance based on the at least one output signal.

16. The method of claim 15 further comprising:

passively balancing, by the passive battery balancing circuitry, each charge of each battery of the plurality of battery cells.

17. The method of claim 15, further comprising:

determining, by the battery management system, a state of health of at least one of the plurality of battery cells based on the at least one impedance.

18. The method of claim 15, wherein the at least one impedance includes at least one impedance for each of the plurality of battery cells.

19. The method of claim 15, wherein the passive battery balancing circuitry and the EIS circuitry are part of an integrated circuit.

20. The method of claim 15, wherein the at least one stimulus signal is comprised of a square wave, a triangle wave, or a sine wave.

* * * * *